United States Patent
Viswanathan et al.

(10) Patent No.: US 8,315,478 B2
(45) Date of Patent: Nov. 20, 2012

(54) COORDINATE SYSTEM CONVERTER

(75) Inventors: Nungavaram Sundara Viswanathan, San Jose, CA (US); Matthias Frank, Dresden (DE)

(73) Assignee: DFMSim, Inc., Redwood City, CA (US)

(*) Notice: Subject to any disclaimer, the term of this patent is extended or adjusted under 35 U.S.C. 154(b) by 961 days.

(21) Appl. No.: 12/257,254

(22) Filed: Oct. 23, 2008

(65) Prior Publication Data
US 2009/0103800 A1   Apr. 23, 2009

Related U.S. Application Data

(60) Provisional application No. 60/982,069, filed on Oct. 23, 2007.

(51) Int. Cl.
*G06K 9/32* (2006.01)
(52) U.S. Cl. ............... 382/293; 702/95; 382/151
(58) Field of Classification Search .......... 382/293, 382/151; 356/237.2–237.5, 72–73, 239.8, 356/614, 620; 702/94, 95
See application file for complete search history.

(56) References Cited

U.S. PATENT DOCUMENTS

| | | | |
|---|---|---|---|
| 5,973,785 A | 10/1999 | Okamoto | |
| 6,125,304 A | 9/2000 | Suzuki | |
| 6,587,201 B2 * | 7/2003 | Nishi | 356/401 |
| 6,766,343 B1 | 7/2004 | Bell et al. | |
| 7,207,017 B1 | 4/2007 | Tabery et al. | |
| 2004/0075852 A1 * | 4/2004 | Wang et al. | 358/1.9 |
| 2007/0254386 A1 * | 11/2007 | Asano | 438/14 |
| 2008/0147222 A1 * | 6/2008 | McIntyre et al. | 700/108 |
| 2008/0246934 A1 * | 10/2008 | Van Den Biggelaar | 355/53 |

OTHER PUBLICATIONS

Kappel and Best, "Optimizing critical photolithography steps in IC manufacturing processes," Micromagazine.com, pp. 1-7 (Apr. 2005).

* cited by examiner

*Primary Examiner* — Tarifur Chowhury
*Assistant Examiner* — Michael P Lapage
(74) *Attorney, Agent, or Firm* — Kilpatrick Townsend & Stockton LLP

(57) ABSTRACT

A coordinate system converter efficiently converts coordinates of one coordinate system to a different coordinate system. A base system library module provides a common platform where different algorithms based on different coordinate systems can "shake hands" or be integrated into an overall conversion process in a manner that is transparent to each other. The number of supported coordinate systems can be dynamically extended without changing software to support different tools.

25 Claims, 5 Drawing Sheets

COORDINATE SYSTEM CONVERTER

CROSS-REFERENCES TO RELATED APPLICATIONS

This application claims priority to U.S. Provisional Patent Application No. 60/982,069, filed on Oct. 23, 2007, which is incorporated herein for all purposes.

TECHNICAL FIELD

The present invention relates to a coordinate system converter and, more particularly, to a coordinate system converter that converts target coordinates from any process step in a semiconductor manufacturing process to a coordinate system that is compatible with any other process step.

BACKGROUND

The semiconductor industry uses several different coordinate systems for wafer related data interpretation. Many different coordinate systems are used because common coordinate systems (e.g., Cartesian or polar) alone cannot fulfill the requirements of all semiconductor manufacturing processes. Each system reflects the specific technical requirements of the particular process or design stage of the semiconductor fabrication process and is used to describe wafer related process measurements and controls. Thus, the different coordinate systems must be supported throughout the fabrication process from the design phase to the final test sequences.

Example processes used in the fabrication of integrated circuits include lithography, metrology, chemical mechanical polishing (CMP), design center, and mask house. Lithography uses a field-based coordinate system defined by the exposed field, which has the same orientation as the wafer. Lithography utilizes a center field vector and an intra field vector to identify positions on a wafer. Metrology operates at the chip level using a die map based coordinate system with a die index (row, column) and an intra die coordinate in the wafer orientation.

In general, process tools define coordinate systems based on the semiconductor device designs, desired data output and location specificity desired for process refinements and controls. Metrology, for example, utilizes orthogonal coordinates based on x-y translation of the wafer stages. CMP is based on tool mechanics and uses radial coordinates for defining target positions due to the rotational movement of the CMP tools. The data from CMP tools are wafer related coordinates in a polar coordinate system separated into regions with several radius ranges. Design center process tools operate at the chip and field level with a base orientation, which is defined by the design. Since the chip may be rotated on a mask, a combination of different coordinate systems may be used. Mask house process tools utilize a field based coordinate system having a predefined orientation (e.g., intra field and intra die). Other coordinate system may be used for other fabrication processes.

Since different coordinate systems are used for identifying different locations on a wafer, in each process step, external software is needed to interconvert the coordinate systems to define a position on the wafer accurately. Conventional manual conversion processes are time consuming and generally several repeated conversions are required, adversely affecting conversion accuracy. Tools used in the semiconductor manufacturing process need to recognize displacement precisely (e.g., on the order of nanometers). However, each tool may be based on a particular type of movement when processing the wafer in accordance with a specific coordinate system.

Due to the presence of many different kinds of software tools, a coordinate conversion system is required for a tool to be accurately displaced. Tool companies may provide conversion software as add-ons. However, these add-ons do not extend beyond one or two possible conversions and do not cover all of the conversions needed. Furthermore, multiple conversions require high effort for all software tools to be developed and maintained. As device geometries shrink and wafer sizes increase, the system may become overloaded with context-based information for each tool/process step in the fabrication.

What is needed is a method and apparatus for performing coordinate system conversions for semiconductor processing that can efficiently convert one coordinate system to another coordinate system using limited computational resources.

SUMMARY

Embodiments of the present invention provide a coordinate system converter that quickly converts coordinates of one coordinate system to a different coordinate system. A base system library module provides a common platform where different algorithms based on different coordinate systems can "shake hands" or be integrated into an overall conversion process in a manner that is transparent to each other. The number of supported coordinate systems can be dynamically extended without changing software to support different tools.

Embodiments of the invention also solves the problem that incoming data may not be converted because the conversion requires wafer map information (or form information), which is not available when the data arrives. Often the data transfer method is restricted to one core data coordinate system, which requires a conversion for new tool data. The coordinate system converter in accordance with embodiments of the present invention allows data transfer between any implemented coordinate system. A conversion is automatically triggered in response to a first request for a specific coordinate system. The conversion is usually performed on the server side where the wafer map information is available.

Embodiments of the present invention may include one or more of the following features. The location of wafer related process data may be described in any predefined or user specific coordinate system. For example, a coordinate system may be defined by absolute or relative displacement. The wafer related process data can be written, transferred and read using any of the supported coordinate systems. The wafer related process data may be converted between all predefined and user specific coordinate systems, as long as all required setup information is available. Extensions to functional software and new data format support do not require changes in a data handling core. New process areas including a corresponding coordinate system may be easily integrated.

In some embodiments, the present invention is directed to a method for converting a first coordinate system to a second coordinate system. The method includes receiving coordinates associated with a first coordinate system. A process to be performed is identified. The identified process is performed using coordinates associated with a second coordinate system. Conversion information is accessed to convert the coordinates associated with the first coordinate system to the second coordinate system with the corresponding coordinates. The conversion information includes data for algorithmically converting the coordinates associated with the first coordinate system to coordinates associated with a plurality of coordinate systems. The received coordinates are converted using the conversion information such that the converted coordinates are associated with the second coordinate system.

In some embodiments, the present invention is directed to a coordinate system converter for converting a first coordinate system to a second coordinate system. A base system library can dynamically manage conversion algorithms for converting the first coordinate system to a plurality of coordinate systems. The coordinate system converter is configured to receive coordinates associated with the first coordinate system. A process to be performed is identified by accessing the process data from the base system library. The identified process is performed using coordinates associated with a second coordinate system. At least one conversion algorithm is accessed from the base system library to convert the coordinates associated with the first coordinate system to the coordinates associated with the second coordinate system. The received coordinates are converted using the at least one conversion algorithm such that the converted coordinates are associated with the second coordinate system.

These and other advantages of the invention will be apparent to those of ordinary skill in the art by reference to the following detailed description and the accompanying drawings.

DETAILED DESCRIPTION

Embodiments of the present invention provide a coordinate system converter that quickly converts coordinates of one coordinate system to a different coordinate system. A base system library module provides a common platform where different algorithms based on different coordinate systems can "shake hands" or be integrated into an overall conversion process in a manner that is transparent to each other. The number of supported coordinate systems can be dynamically extended without changing software to support different tools.

The coordinate system converter in accordance with embodiments of the present invention provides structured data definitions for input data and source code for data integration. Access is provided to file converters, coordinate systems and data structures. The coordinate system converter includes open interfaces for the integration of new coordinate systems, coordinate system converters and process data structures. These features and capabilities allow coordinate system conversions for semiconductor processing that can efficiently convert one coordinate system to another coordinate system using limited computational resources.

Figure 1:
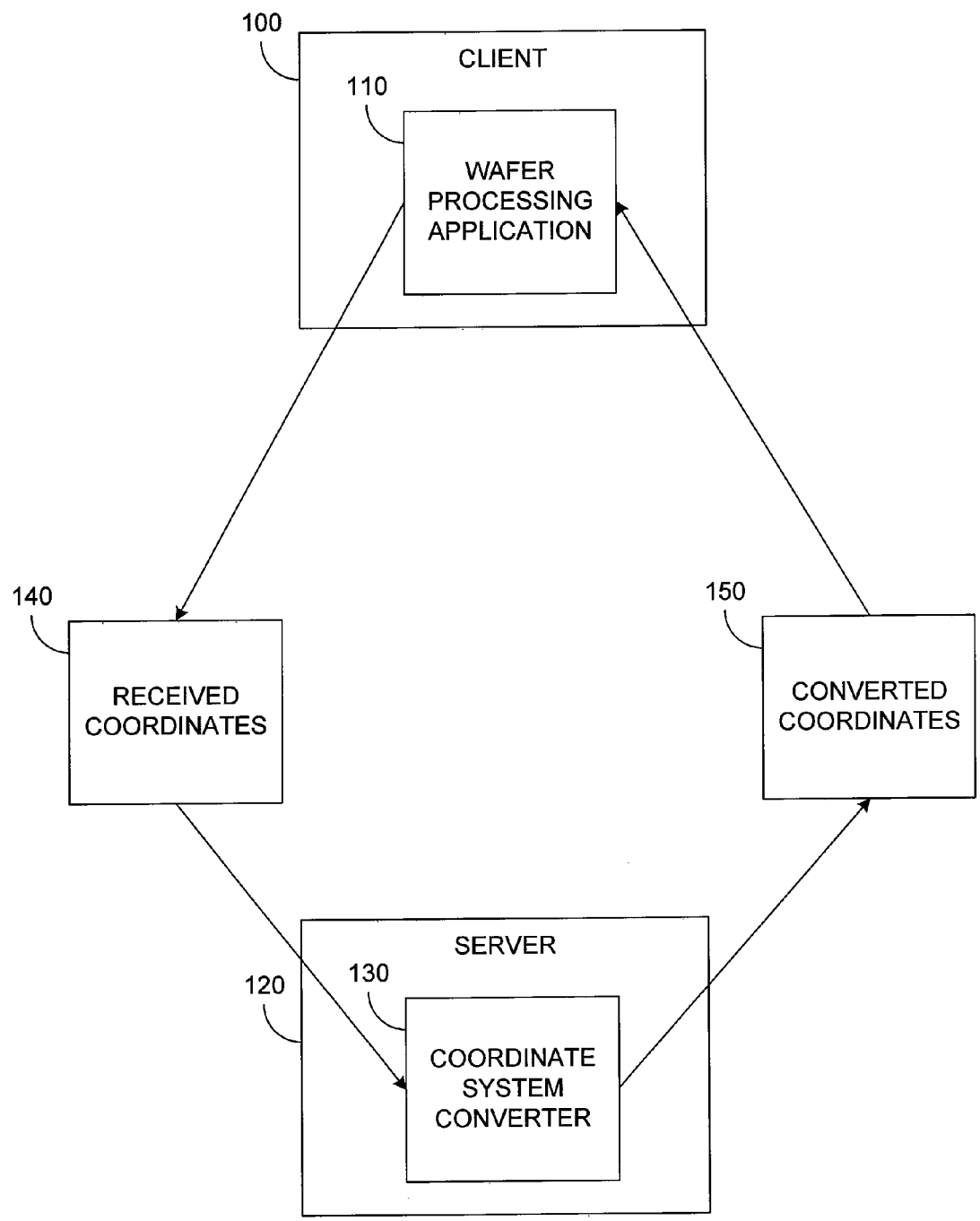
FIG. 1 is a block diagram of a system for converting coordinate systems in a computing environment in which embodiments of the present invention are implemented.

FIG. 1 is a block diagram of a system for converting coordinate systems in a computing environment in which embodiments of the present invention are implemented. The system includes a client 100 in communication with a server 120. Communication between the client 100 and the server 120 may occur over different types of communication, which can transfer data between the client 100 and the server 120. This includes network based channels like a local area network (LAN), a wide area network (WAN), a controller area network, a wireline or wireless network, or any other type of network or local communication like functional calls or inter-process communications.

A wafer processing application 110 executes online on the client 110 during the manufacture of semiconductor wafers or offline using process data stored in a database. The wafer processing application 110 performs a variety of different procedures for semiconductor device fabrication. For example, the wafer processing application 110 may implement semiconductor wafer manufacture processes related to deposition, removal, patterning and doping.

The wafer processing application 110 may receive coordinates 140 in a coordinate system related to one type of process. However, a subsequent process may not be compatible with the coordinate system of the received coordinates 140. The received coordinates 140 are converted into a different coordinate system that is compatible with the subsequent process by a coordinate system converter 130 executing on the server 120. The received coordinates 140 may be directly converted to those needed for a subsequent process or may be converted into an intermediary or canonical set of coordinates that may then be converted to those needed for the subsequent process.

In one embodiment, the coordinate system converter 130 identifies a number of different conversion processes for converting the received coordinates 140 to the converted coordinates 150. The coordinate system converter 130 also identifies the conversion information that is required for each identified conversion process and whether the required conversion information is readily available. For example, a conversion process that has all of the necessary conversion information stored at the server 130 could provide an efficient method for converting the received coordinates 140 to the converted coordinates 150. Likewise, if none of the necessary conversion information is stored at the server 130, that conversion process may not be an efficient method for converting the received coordinates 140 to the converted coordinates 150. Thus, the coordinate system converter 130 dynamically converts the received coordinates 140 to the converted coordinates 150 using the identified conversion process that can most efficiently complete the conversion in accordance with the available conversion information that is required to complete the conversion process.

After the coordinate system converter 130 converts the received coordinates 140 into coordinates 150 that correspond to a coordinate system that is compatible with the subsequent process, the server 120 provides the converted coordinates 150 to the client 100. The wafer processing application 110 may then execute the subsequent process using the converted coordinates 150.

Figure 2:
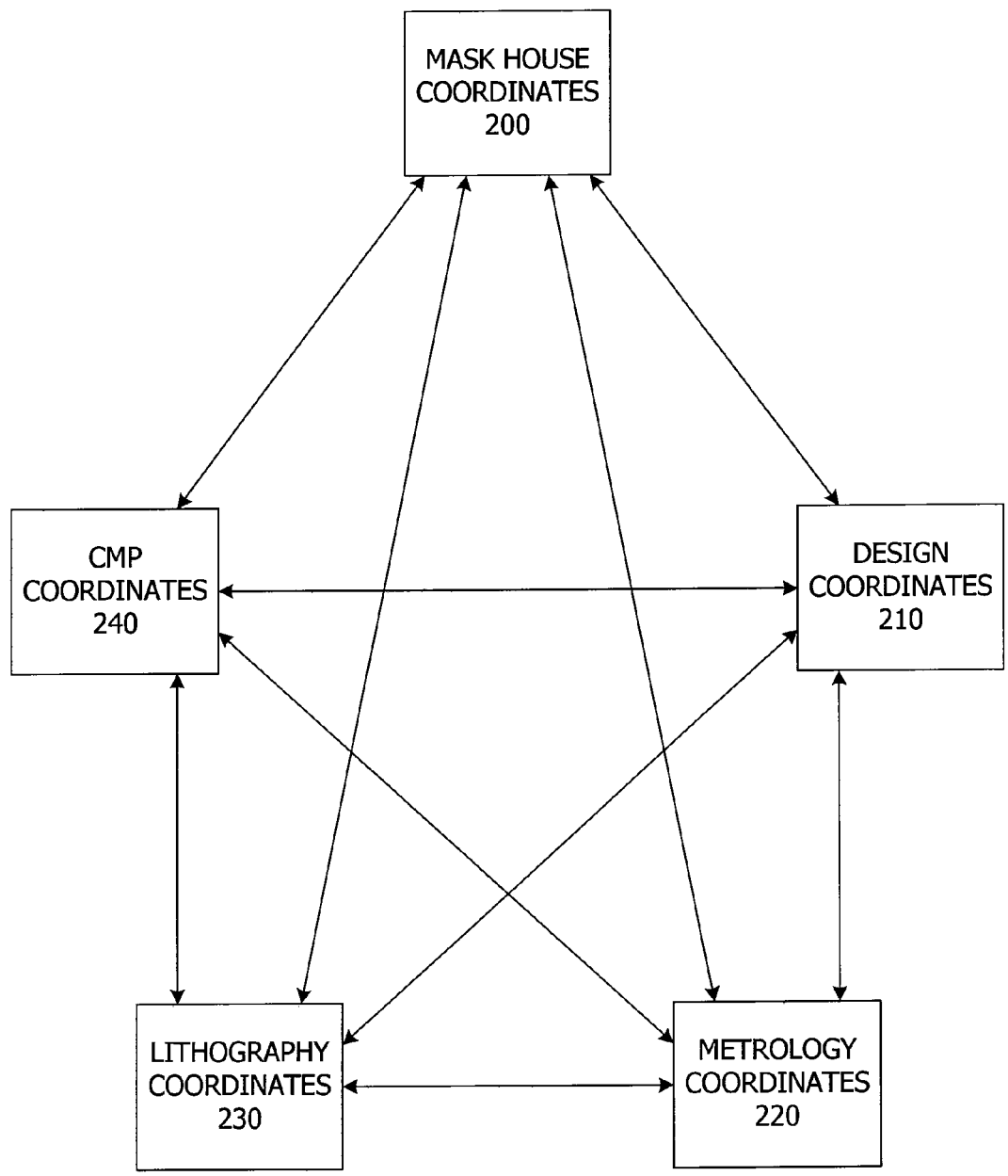
FIG. 2 is a state diagram illustrating the relationship between different coordinate systems in accordance with some embodiments of the present invention.

FIG. 2 is a state diagram illustrating the relationship between different coordinate systems that may be part of a set of semiconductor processing operations and that may be subject to the coordinate conversion process of some embodiments of the present invention. Examples of different coordinate systems include mask house coordinates 200, design coordinates 210, metrology coordinates 220, lithography coordinates 230 and chemical mechanical polishing (CMP) coordinates 240. As shown in the figure, any one of the coordinate system can be converted to any other of the coordinate system using the coordinate system converter 130 in accordance with embodiments of the present invention. As one having ordinary skill in the art would appreciate, the coordinate system converter 130 in accordance with embodiments of the present invention could be used to convert to/from other coordinate systems in addition to the coordinate systems shown in FIG. 2.

Figure 3:
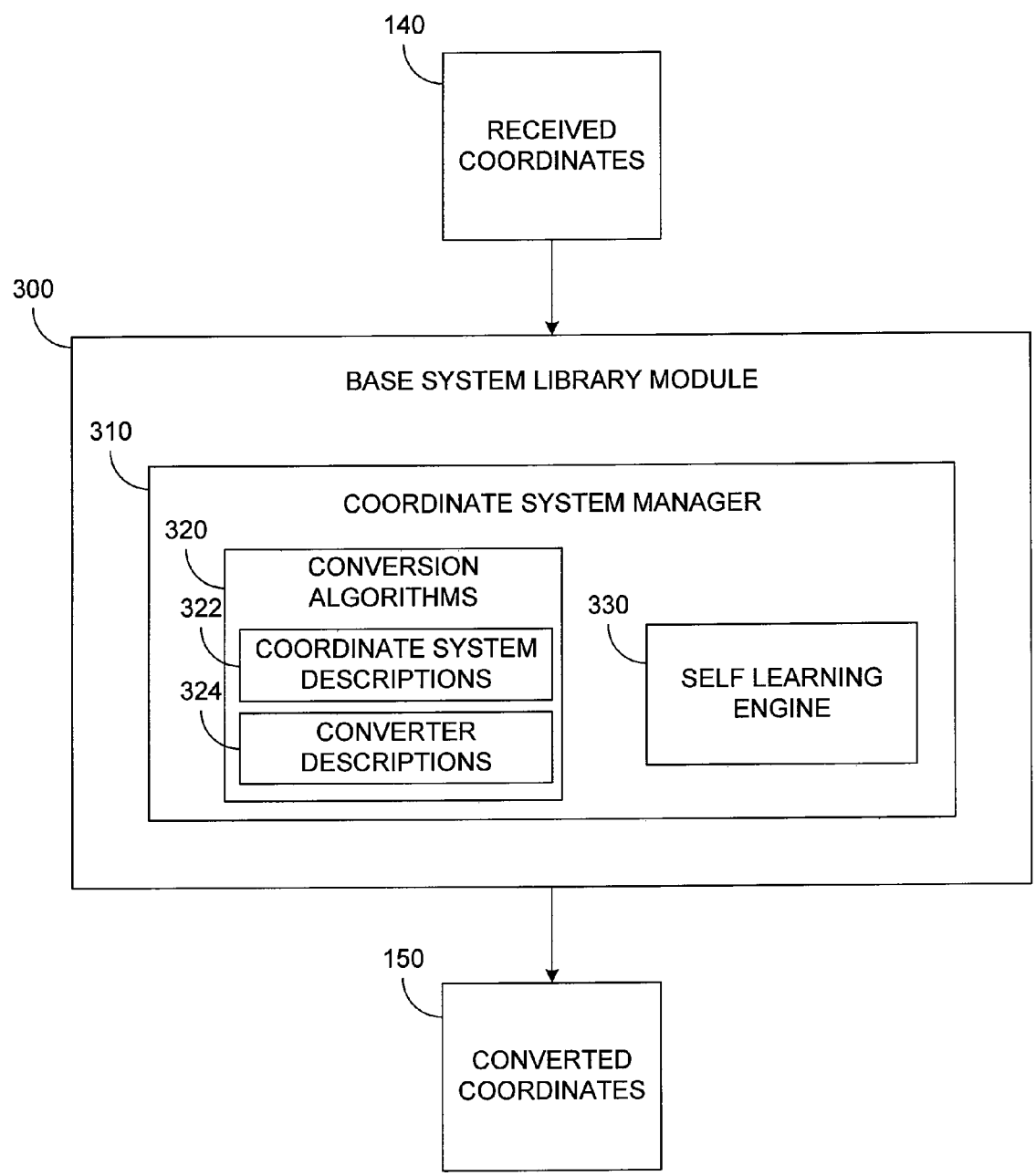
FIG. 3 is a block diagram of a coordinate system converter system in accordance with some embodiments of the present invention.

FIG. 3 is a block diagram of the coordinate system converter system in accordance with some embodiments of the present invention. As discussed above, the coordinate system converter converts, transforms, or otherwise changes received coordinates 140 into converted coordinates 150. The received coordinates 140 and the converted coordinates 150 may correspond to wafer-based process data. The coordinate system converter operates on input data (e.g., a set of data points) and may change system coordinates to an intermediate reference base system. The conversion may be performed mathematically without reference to look up tables. The coordinate system converter includes a base system library module 300 and a coordinate system manager 310 that store different types of conversion information. Examples of conversion information include conversion algorithms 320 and coordinate system information.

The conversion algorithms 320 include algorithms for converting the received coordinates 140 into the converted coordinates 150. The conversion algorithms 320 include coordinate system descriptions 322 and converter descriptions 324. The coordinate system descriptions 322 and the converter descriptions 324 are derived from interfaces, which are part of the base system library module 300. The interfaces are open to be used for extension and by clients.

Data in any specific coordinate system contains one or more components, e.g. the metric length measurement system uses a meter as a unit, and the component of data is, for example, 5 meters. In a Cartesian coordinate system there are two components (x and y) for the two dimensions of space. Coordinate components are provided as small letters in brackets. The converter descriptions 324 may describe processes for converting from a specific complete coordinate system to another complete coordinate system. The converter descriptions may describe processes for converting an incomplete coordinate system (e.g., one or more components which are part of a complete coordinate system) to another coordinate system. For example, coordinate system A may include components [a, b, c] and coordinate system B may include components [d, b, c]. A complete converter converts components [a, b, c] to components [d, b, c]. However, an incomplete converter would only convert component [a] to component [d]. In these examples, both converters translate coordinate system A to coordinate system B. An incomplete converter [a]→[d] can be used for several conversions, since for any Z=[ . . . ] the converter can translate [a, Z]→[d, Z], while the complete converter in the example works only for [a, b, c]→[d, b, c].

The wafer-based process data of the coordinates is described using data structures and context references. All values are handled as part of a dataset. The dataset is a hierarchical tree of sub-datasets and data points. A data point usually has a coordinate stored together with a used coordinate system reference. Every data point may contain any number of values, which are assigned to the wafer at this location.

The coordinate system manager 310 also includes a self-learning engine 330. The self-learning engine 330 scans the base system library module 300 for all coordinate systems and converters. In some embodiments, in an optimization process, the self learning engine 330 builds a state diagram containing all coordinate systems as nodes and all converters as edges. Each edge in the tree represents a conversion from a coordinate system A to an coordinate system B. The diagram contains all found coordinate systems. The edges (i.e., converters) represent the found converters and the converters generated during the optimization process based on rules. An optimizer uses the rules to extend the edges to a full description of all possible routes. Examples of possible rules include:

1. (A→B) & (B→C)→(A→C)

Thus, when a first converter is used to convert from A to B and a second converter converts from B to C, then a conversion route is generated from A to C.

2. ([a]→[d]) & (A=[a, b, c]) & (B=[d, b, c])→(A→B)

If there is an incomplete converter for the components [a] and [d] ([a]→[d]) and two existing coordinate systems include A=[a, b, c] and B=[d, b, c], then a new conversion route is generated from A to B.

In some embodiments, the implemented converters and generated routes are stored in a hash tree to provide quick access to the conversion information. After generation of all possible routes, concurrent routes may be possible. Converters are called concurrent when both converters have the same conversion A→B. In some embodiments, the routes are dynamically marked with cost information. Cost information is any information about performance (i.e., required time), resource allocation (i.e., memory, CPU) or any other requirement. The cost information may be used to find the best route or cheapest cost for a requested conversion. For example, one converter may be considered to provide a more efficient conversion relative to a different converter because all or most of the conversion information that is necessary to complete the conversion is readily available (i.e., the conversion information need not be retrieved from external sources).

The following example describes a situation where the coordinate system converter in accordance with embodiments of the present invention may be applied. In the example, an independent metrology tool may deliver target coordinates with incorrect center field (CF) coordinates. In the case of shifted rows, the coordinates do not contain the shift and indicate an incorrect location on the wafer. Such values cannot be used for any effective analyses and require correction. The correction software needs information to identify which fields are shifted. A conventional way to address the problem extends a core portion of the used software to implement the correction, often resulting in side effects and critical bugs.

Using the coordinate system converter 130 in accordance with embodiments of the present invention, the problem of incorrect coordinates can be solved by implementing a new coordinate system. The new coordinate system describes the "uncorrected" values and extends the system by a converter to build a bridge to a lithography standard system. Thus, the following code blocks may be implemented: a new component called [cf2] (uncorrected CF vector); CF2_IF (if=intra field) the coordinate system for the new data representation containing all formatting code; and a [cf2] to [cf] converter, which takes a [cf2] vector and corrects this vector to a [cf] vector. These code blocks are independent from existing code and are placed as customer specific classes to a customer library. There is no change to any core part of the software solution. Any side effects to other customer implementations or other software modules are avoided and testing is limited to a pure testing of the conversion.

As described above, the coordinate system converter in accordance with embodiments of the present invention eliminates barriers between different coordinate systems. The coordinate system converter is extendable such that multiple coordinate systems may be converted, flexible coordinate transformation is provided, and correlation between process areas is allowed.

Figure 4:
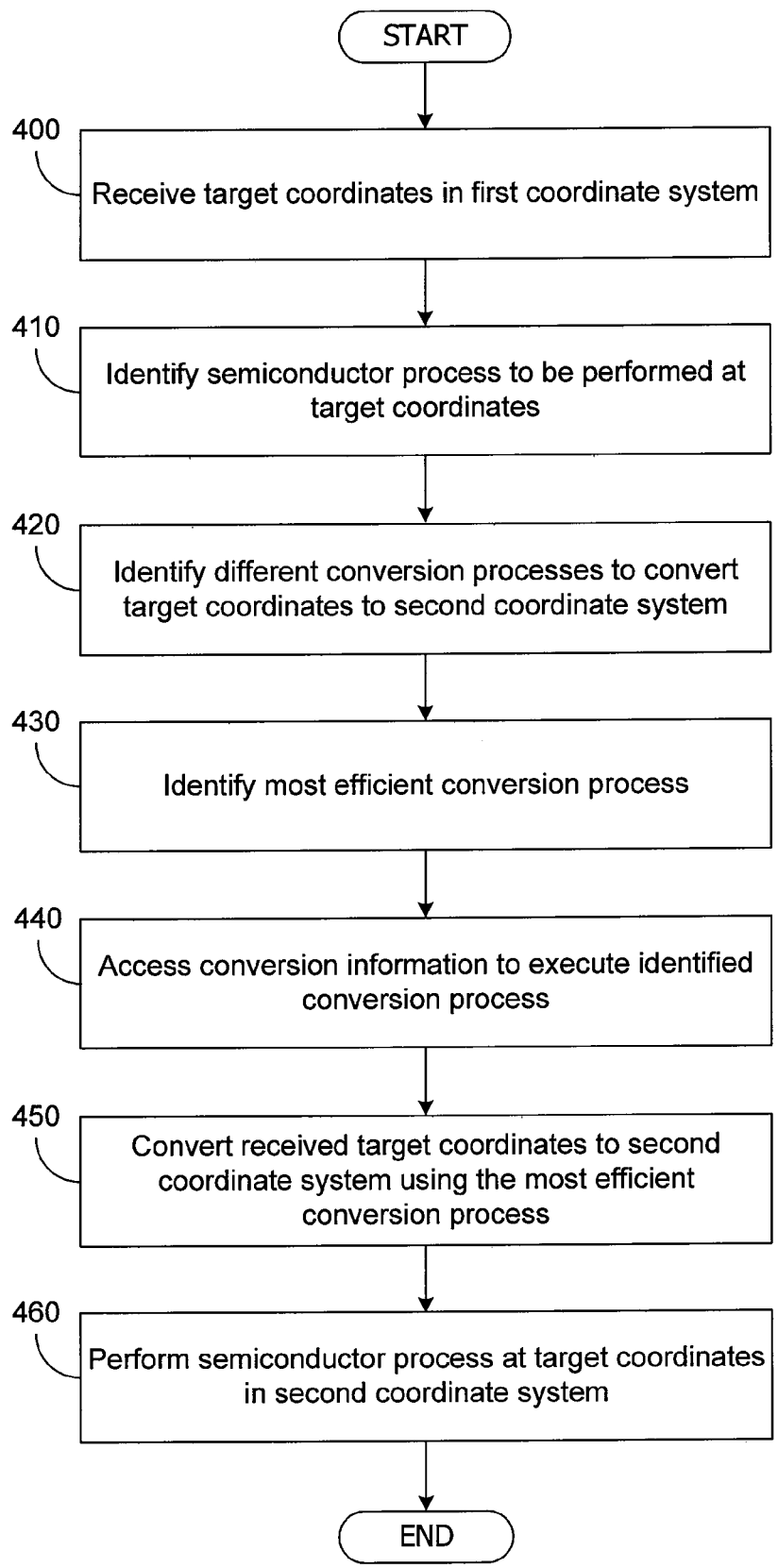
FIG. 4 is a flow diagram of a process for converting coordinates from one coordinate system to a different coordinate system in accordance with some embodiments of the present invention.

FIG. 4 is a flow diagram of a process for converting coordinates from one coordinate system to a different coordinate system in accordance with some embodiments of the present invention.

Target coordinates are received in a first coordinate system (step 400). The target coordinates identify locations on a semiconductor wafer where a semiconductor process may be performed. For example, the target coordinates may correspond to a field base coordinate system used in a lithography process. In another example, the target coordinates may correspond to a user-defined coordinate system.

The semiconductor process to be performed at the target coordinates is identified (step 410). When the semiconductor process to be performed is identified, the software determines that the semiconductor process cannot be performed using the target coordinates in the first coordinate system. In other words, the semiconductor process requires target coordinates in a different coordinate system in order to be performed accurately on a wafer. Each semiconductor process is related to a specific coordinate system. CMP, for example, is related to a polar system. The software used for production and online/offline analyses uses data from different processes. To run correlation or to work with data from different process tools (e.g., different generation, different vendors, different processes, etc.), often the data are not related to the same coordinate system and require a conversion.

Different conversion processes are identified for converting the target coordinates to the second coordinate system (step 420). Some of the conversion processes may be more efficient to execute than other conversion processes. For example, some conversion processes may require more memory allocation to complete the conversion than other conversion processes. In another example, some conversion processes may directly convert the target coordinates to the second coordinate system, while other conversion processes may require conversion to one or more intermediate or canonical coordinate system before converting the coordinates to the second coordinate systems. Similarly, some conversion processes may have all of the conversion information necessary to complete the conversion readily available for retrieval from a local data source, while other conversion processes may need to access some, most or all of the conversion information from an external source.

The most efficient conversion process is then identified (step 430). Considerations for determining the most efficient conversion process include the amount of time required to complete the conversion, the amount of memory allocated to execute the conversion process, the availability of conversion information necessary to convert the target coordinates to the second coordinate system, etc.

Conversion information is accessed to execute the identified conversion process to convert the target coordinates to the second coordinate system (step 440). The conversion information may be accessed from a base system library that includes conversion data for algorithmically converting the target coordinates to coordinates associated with different types of supported coordinate systems. In some embodiments, it may be necessary to retrieve the conversion information from an external source if the information is not available from the base system library.

The received target coordinates are converted to the second coordinate system using the accessed conversion information (step 450). The conversion may be applied to all of the received target coordinates (i.e., complete conversion) or some of the received target coordinates (i.e., incomplete conversion). The semiconductor process is then performed at the target coordinates converted to the second coordinate system (step 460).

Process departments use different coordinate systems, so much development time and effort goes into implementing context conversions. Sometimes incoming data cannot be converted while the infrastructure and existing software applications receive the data in a tool specific coordinate system. For example, data coming from a new metrology tool may require a form description of an unavailable wafer map for the conversion. The coordinate system converter in accordance with embodiments of the present invention allows data description in the tool specific coordinate system. The conversion is performed when the first request for the standard is called.

Software maintenance enhancements support new coordinate systems or process areas with a different context. Usually this requires a change of the complete conversion modules, which is a critical part of every software solution. Providing a flexible and extendible approach, in accordance with embodiments of the present invention, reduces the risk of a new software error (e.g., bug) and reduces the implementation time of new software versions.

In accordance with some embodiments of the present invention, data from different process areas are supported. Any process data can be stored and transmitted in the original form. Also, the output can be provided to any process department or to any external software module in the requested coordinate system without extra effort.

The process of data conversion in accordance with embodiments of the present invention supports the requirements for model based design software for the semiconductor industry. This is important because when the user (e.g., designer of models) can design algorithms (i.e., models) without being restricted by context, it increases the likelihood that a solution can be implemented successfully.

Figure 5:
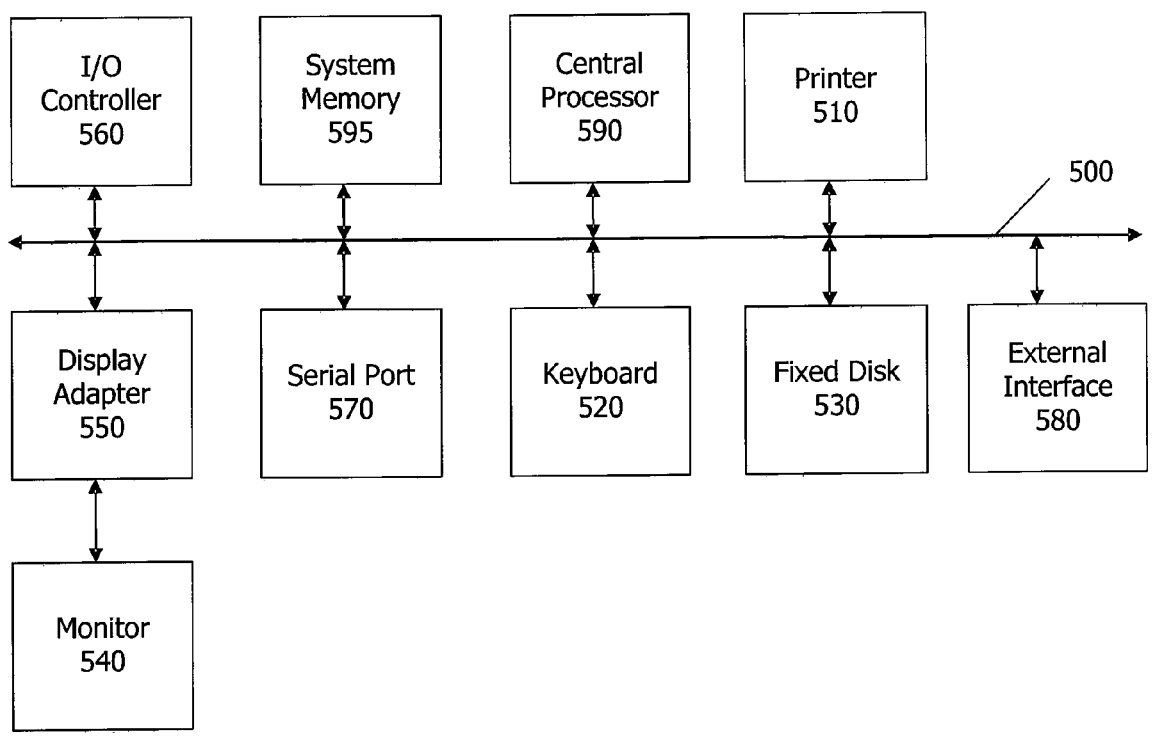
FIG. 5 shows an exemplary block diagram of some elements that may be present in a computer device configured to convert coordinate systems according to some embodiments of the invention.

FIG. 5 shows an exemplary block diagram of some elements that may be present in a computer device configured to convert coordinate systems according to some embodiments of the invention. The subsystems shown in FIG. 5 are interconnected via a system bus 500. Additional subsystems such as a printer 510, a keyboard 520, a fixed disk 530, a monitor 540, which is coupled to a display adapter 550, and others are shown. Peripherals and input/output (I/O) devices, which couple to an I/O controller 560, can be connected to the computer system by any number of means known in the art, such as a serial port 570. For example, the serial port 570 or an external interface 580 can be used to connect the computer apparatus to a wide area network such as the Internet, a mouse input device, or a scanner. The interconnection via the system bus 500 allows a central processor 590 to communicate with each subsystem and to control the execution of instructions from a system memory 595 or the fixed disk 530, as well as the exchange of information between subsystems. The system memory 595 and/or the fixed disk 530 may embody a computer readable medium.

As is apparent from the above description, a coordinate system converter quickly converts coordinates of one coordinate system to a different coordinate system. A base system library module provides a common platform where different algorithms based on different coordinate systems can "shake hands" or be integrated into an overall conversion process in a manner that is transparent to each other. The number of supported coordinate systems can be dynamically extended without changing software to support different tools.

The present invention has been described in terms of specific embodiments. As will be understood by those skilled in the art, the embodiments illustrated above may be modified, altered, and changed without departing from the scope of the present invention. The scope of the present invention is defined by the appended claims.

What is claimed is:

1. A method for converting a first coordinate system to a second coordinate system, the method comprising:
   receiving coordinates associated with a first coordinate system;
   identifying a process to be performed;
   identifying a second coordinate system from among a plurality of coordinate systems distinct from the first coordinate system, the identifying of the second coordinate system based at least in part on the process to be performed;
   identifying an optimally efficient converter from a plurality of converters for converting the received coordinates to the second coordinate system, wherein identifying the optimally efficient converter from the plurality of converters comprises:
      constructing a conversion state diagram having the first coordinate system and the plurality of coordinate systems as nodes;
      determining a cost of each available conversion between nodes; and
      determining a plurality of costs corresponding to a plurality of routes through the conversion state diagram from the first coordinate system to the second coordinate system;
   accessing conversion information associated with the identified converter to convert the coordinates associated with the first coordinate system to the second coordinate system, wherein the conversion information comprises data for algorithmically converting coordinates associated with the first coordinate system to coordinates associated with a plurality of coordinate systems; and
   executing the identified converter using the accessed conversion information to convert the received coordinates to the second coordinate system.

2. The method of claim 1, wherein identifying the optimally efficient converter comprises identifying the optimally efficient converter from the plurality of converters based on at least one of: availability of conversion information associated with the converter, an amount of memory allocation necessary to execute the converter, a number of process steps required to execute the converter, and an amount of time required to execute the converter.

3. The method of claim 1, wherein the process is associated with a semiconductor wafer processing application.

4. The method of claim 3, wherein the process is associated with one of a mask house process, a design process, a metrology process, a lithography process and a chemical mechanical polishing process.

5. The method of claim 3, wherein the received coordinates and the converted coordinates identify locations on a semiconductor wafer where the process is performed.

6. The method of claim 1, further comprising:
   performing the process using the converted coordinates.

7. The method of claim 1, wherein identifying the process comprises identifying the process to be performed using the received coordinates.

8. The method of claim 1, wherein the received coordinates are completely converted to the second coordinate system.

9. The method of claim 1, wherein the received coordinates are partially converted to the second coordinate system.

10. The method of claim 1, wherein the first coordinate system is one of a field base coordinate system, a polar coordinate system, a Cartesian coordinate system and a user-defined coordinate system, and wherein the second coordinate system is the other of a field base coordinate system, a polar coordinate system, a Cartesian coordinate system and a user-defined coordinate system.

11. The method of claim 1, wherein the identified process can not be performed using the received coordinates.

12. A server configured to perform the method of claim 1.

13. The method of claim 1, wherein identifying the optimally efficient converter from the plurality of converters further comprises identifying one of the plurality of routes through the conversion state diagram as having a lowest cost.

14. The method of claim 1, wherein the cost of each available conversion is based at least in part on an amount of computational resources required to perform the available conversion.

15. The method of claim 1, wherein the cost of each available conversion is based at least in part on whether remote access of information is required to perform the available conversion.

16. The method of claim 1, wherein the cost of each available conversion is based at least in part on an amount of time required to perform the available conversion.

17. A coordinate system converter for converting a first coordinate system to a second coordinate system, the coordinate system converter comprising:
   at least one processor; and
   a base system library configured at least to store process data and conversion algorithms for converting the first coordinate system to a plurality of coordinate systems,
   wherein the coordinate system converter is configured with computer-executable instruction that, when executed by said at least one processor, cause the coordinate system converter to, at least:
      receive coordinates associated with the first coordinate system;
      identify a process to be performed at least in part by accessing the process data from the base system library;
      identify a second coordinate system among the plurality of coordinate systems based at least in part on the process to be performed;
      identify an optimally efficient converter from a plurality of converters for converting the received coordinates to the second coordinate system, wherein identifying the optimally efficient converter from the plurality of converters comprises:
         constructing a conversion state diagram having the first coordinate system and the plurality of coordinate systems as nodes;
         determining a cost of each available conversion between nodes; and
         determining a plurality of costs corresponding to a plurality of routes through the conversion state diagram from the first coordinate system to the second coordinate system;
      access at least one conversion algorithm associated with the identified converter from the base system library to convert the coordinates associated with the first coordinate system to the second coordinate system; and execute the identified converter using the at least one conversion algorithm to convert the received coordinates to the second coordinate system.

18. The method of claim 17, wherein the coordinate system converter identifies the optimally efficient converter from the plurality of converters based on at least one of: availability of conversion information associated with the converter for converting the received coordinates to the second coordinate system, an amount of memory allocation necessary to execute the converter, a number of process steps required to execute the converter, and an amount of time required to execute the converter.

19. The coordinate system converter of claim 17, wherein the conversion algorithms comprise descriptions of the plurality of coordinate systems.

20. The coordinate system converter of claim 17, wherein the conversion algorithms comprise converter descriptions for describing processes for converting coordinates of the first coordinate system to coordinates corresponding to the plurality of coordinate systems.

21. The coordinate system converter of claim 17, wherein the process is associated with a semiconductor wafer processing application.

22. The coordinate system converter of claim 17, further comprising:

a self learning engine configured to establish conversion rules based on relationships between the plurality of coordinate systems and the conversion algorithms, wherein the conversion rules are stored in the base system library.

23. The coordinate system converter of claim 22, wherein the self learning engine is further configured to optimize conversion of data based on cheapest cost information, the cost information describing time and resources required to convert data from one coordinate system into another coordinate system.

24. A computer program product having a non-transitory computer readable medium storing a set of code modules which when executed by a processor of a computer system cause the processor to convert a first coordinate system to a second coordinate system, the computer program product comprising:

code for receiving coordinates associated with a first coordinate system;

code for identifying a process to be performed;

code for identifying a second coordinate system from a plurality of coordinate systems based at least in part on the process to be performed;

code for identifying an optimally efficient converter from a plurality of converters for converting the received coordinates to the second coordinate system, wherein identifying the optimally efficient converter from the plurality of converters comprises:

constructing a conversion state diagram having the first coordinate system and the plurality of coordinate systems as nodes;

determining a cost of each available conversion between nodes; and determining a plurality of costs corresponding to a plurality of routes through the conversion state diagram from the first coordinate system to the second coordinate system;

code for accessing conversion information associated with the identified converter to convert the coordinates associated with the first coordinate system to the second coordinate system, wherein the conversion information comprises data for algorithmically converting coordinates associated with the first coordinate system to coordinates associated with a plurality of coordinate systems; and code for executing the identified converter using the accessed conversion information to convert the received coordinates to the second coordinate system.

25. The computer program product of claim 24, further comprising:

code for performing the process using the converted coordinates.

* * * * *